United States Patent
Abadeer et al.

(10) Patent No.: US 8,349,697 B2
(45) Date of Patent: Jan. 8, 2013

(54) FIELD EFFECT TRANSISTOR WITH AIR GAP DIELECTRIC

(75) Inventors: Wagdi W. Abadeer, Jericho, VT (US); Kiran V. Chatty, Williston, VT (US); Robert J. Gauthier, Jr., Hinesburg, VT (US); Jed H. Rankin, Richmond, VT (US); William R. Tonti, Essex Junction, VT (US); Yun Shi, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/537,334

(22) Filed: Jun. 29, 2012

(65) Prior Publication Data

US 2012/0264275 A1    Oct. 18, 2012

Related U.S. Application Data

(62) Division of application No. 12/547,529, filed on Aug. 26, 2009, now Pat. No. 8,216,909.

(51) Int. Cl.
*H01L 21/76* (2006.01)

(52) U.S. Cl. ......... 438/422; 257/E21.409; 257/E21.211; 257/E29.242

(58) Field of Classification Search .............. 438/167, 438/172, 186, 197, 306, 422; 257/288, E21.409, 257/E21.211, E29.242
See application file for complete search history.

(56) References Cited

U.S. PATENT DOCUMENTS

| | | |
|---|---|---|
| 6,576,939 B1 | 6/2003 | Gilton et al. |
| 6,709,969 B1 | 3/2004 | Murray |
| 6,787,862 B2 | 9/2004 | Murray |
| 6,930,034 B2 | 8/2005 | Colburn et al. |
| 7,189,435 B2 | 3/2007 | Tuominen et al. |
| 7,268,432 B2 | 9/2007 | Colburn et al. |
| 2008/0283939 A1 | 11/2008 | Choi et al. |

OTHER PUBLICATIONS

Olafsen, Linda J., et al; "Progress in semiconductor Materials V—Novel Materials and Electronic and Optoelectronic Applications"; Symposium Proceedings vol. 891, Materials Research Society, Warrendale, PA.; p. 239-244; Nov. 28-Dec. 1, 2005.

*Primary Examiner* — Calvin Lee
*Assistant Examiner* — Monica D Harrison
(74) *Attorney, Agent, or Firm* — Cantor Colburn LLP; Richard Kotulak

(57) ABSTRACT

A field effect transistor (FET) that includes a drain formed in a first plane, a source formed in the first plane, a channel formed in the first plane and between the drain and the source and a gate formed in the first plane. The gate is separated from at least a portion of the body by an air gap. The air gap is also in the first plane.

5 Claims, 15 Drawing Sheets

FIELD EFFECT TRANSISTOR WITH AIR GAP DIELECTRIC

CROSS-REFERENCE TO RELATED APPLICATIONS AND PRIORITY CLAIM

This application is a Divisional Application of U.S. Non-Provisional application Ser. No. 12/547,529, entitled "FIELD EFFECT TRANSISTOR WITH AIR GAP DIELECTRIC", filed Aug. 26, 2009, under 35 U.S.C. §120, which is incorporated herein by reference in its entirety.

BACKGROUND

This invention relates to transistors and, in particular, to transistors for use in high voltage devices.

There is increasing demand for high voltage devices in applications such as medical, printer, and automotive applications. High voltage devices require special, and sometimes considerable, development activities to meet several requirements for process integration, performance and reliability. In some instances, field effect transistors (FETs) are used in high voltage devices.

FETs typically have four terminals, which are known as the gate, drain, source and body. The names of the terminals refer to their functions. The gate terminal may be thought of as controlling the opening and closing of a physical gate. This gate permits electrons to flow through or blocks their passage by creating or eliminating a channel through the body between the source and drain. Electrons flow from the source terminal towards the drain terminal if influenced by an applied voltage. The body simply refers to the bulk of the semiconductor in which the gate, source and drain lie. Usually the body terminal is connected to the highest or lowest voltage within the circuit, depending on type.

FIG. 1 shows an example of a typical FET 100. The gate 102 is typically separated from the body 104 by a dielectric layer 106. The dielectric layer 106 (or gate dielectric) is typically formed by a silicon based dielectric material. The purpose, as is well known in the prior art, of the dielectric layer 106 is to separate the gate 102 from the body 104. As shown in FIG. 1, the gate 102 and the dielectric layer 106 are disposed above both the source 108 and the drain 110. As shown, the source 108 and the drain 110 are in the same horizontal plane and the gate 102 is disposed in a horizontal plane above them both. Such a layout shall be referred to herein as a vertical layout (herein).

To maintain electrical integrity of the gate dielectric 106, devices that must operate at higher voltage typically require thicker dielectric avoid electrical breakdown. For a 5V application, a dielectric thickness of about 12 nm is required, and for a 20V application, a dielectric thickness of about 45 nm may be needed. In short, the higher to voltage, the thicker the dielectric layer 106 needs to be.

In addition to the thicker dielectric, high voltage devices should have good device surface mobility, low interface states and low density of fixed trapped charge, so as to ensure good hot carrier reliability and device long term stability. Also the gate dielectric should have low defect density for high yield and a high breakdown electric field for good reliability.

In addition, high voltage devices, in many applications are desired to have good operational characteristics in the RF range above 2 GHz. For that, a FET needs low surface degradation and low interface states for good 1/f noise performance. The FET should also have low gate dielectric capacitance and low dielectric constant to ensure low gate capacitance and a high frequency cut-off point. Also, high voltage devices are often employed in analog applications, such as power amplifiers, thus, it may be desirable for the FET to have a good amplification factor and frequency response.

SUMMARY

One embodiment of the present invention is directed to a field effect transistor (FET) comprising a drain formed in a first plane; a source formed in the first plane; a body formed in the first plane; and a gate formed in the first plane, the gate being separated from at least a portion of the body by an air gap, the airgap being in the first plane.

Another embodiment of the present invention is directed to method of making a field effect transistor (FET) having a drain, a source, a body, a gate, wherein the gate is co-planar with the drain and the source. The method of this embodiment includes forming the gate in a first plane; forming the drain in the first plane; forming the source in the first plane; forming the body in the first plane; and separating at least a portion of the gate from at least a portion of the body by an air gap formed in the first plane.

Another embodiment of the present invention is directed to a method of forming a field effect transistor (FET) including forming first and second silicon strips, the first and second strips being substantially parallel to one another and separated from each other; filling a space between a portion of the first and second silicon strips with an oxide; covering the oxide with a nitride layer; forming a hole in the nitride layer; forming a porous pattern in the nitride layer, forming the pattern including placing a diblock copolymer on top of the nitride layer and, after the diblock copolymer has been self-aligned, etching the nitride through the diblock copolymer; etching the oxide through the nitride layer to form an airgap below the nitride layer; and sealing the air gap.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

Embodiments of the present invention are directed to replacing the dielectric between the gate and the body of FET with an air gap. The air gap shall be referred to as an air-gap dielectric herein due to the dielectric properties of air. In addition, embodiments of the present invention are directed to the method of manufacturing a FET with an air-gap dielectric.

Some embodiments of the present invention may offer some or all of the following advantages: better hot carrier reliability because there are no bulk oxide traps, only native oxide; better long term device stability because of lower interface state density as well as better 1/f noise performance; higher breakdown electric fields due to using an air gap, rather than a dielectric; lower gate dielectric constant and hence lower dielectric capacitance and higher frequency response. Furthermore, because radio frequency (RF) power consumption is proportional to total output capacitance, utilizing an air gap dielectric reduces dielectric constant resulting in lower capacitance and, therefore, lower power consumption.

Furthermore, because many analog circuits operate in the linear range of Vds (drain-to-source voltage), the air gap dielectric FET according to embodiments of the present invention allows Gm to reach it peak and not drop significantly as Vgs (gate-to-source voltgage) increases. This is in contrast to a FET employing a oxide dielectric as the gate dielectric where, when Gm (device transconductance) reaches a peak in the linear range, Gm drops significantly with further increase of Vgs.

Figure 1:
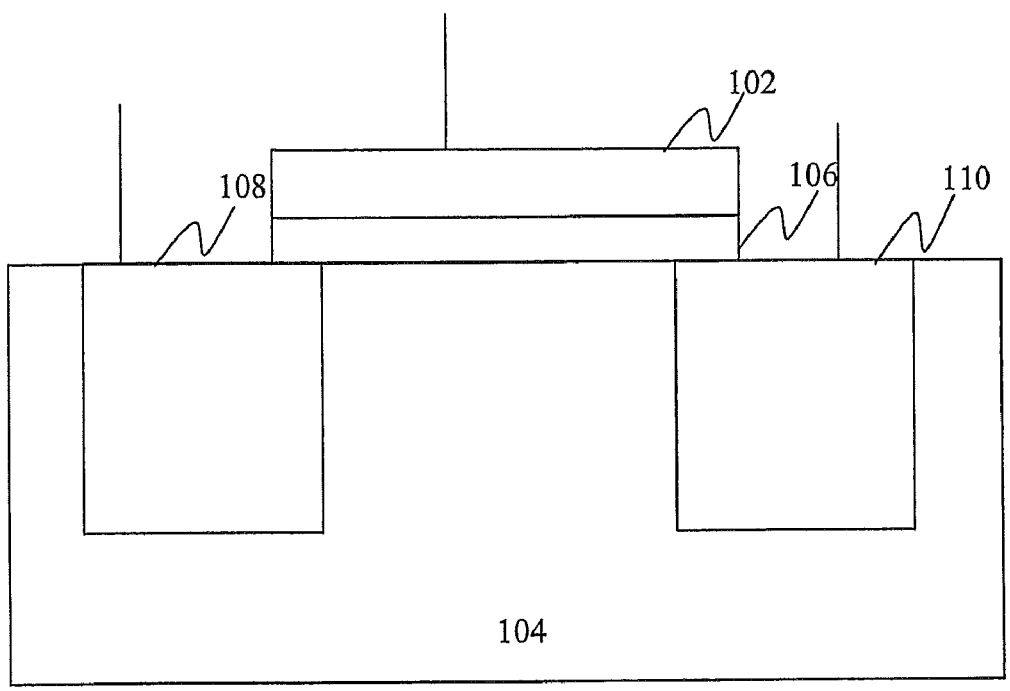
FIG. 1 shows an example of a prior art FET.
Figure 2:
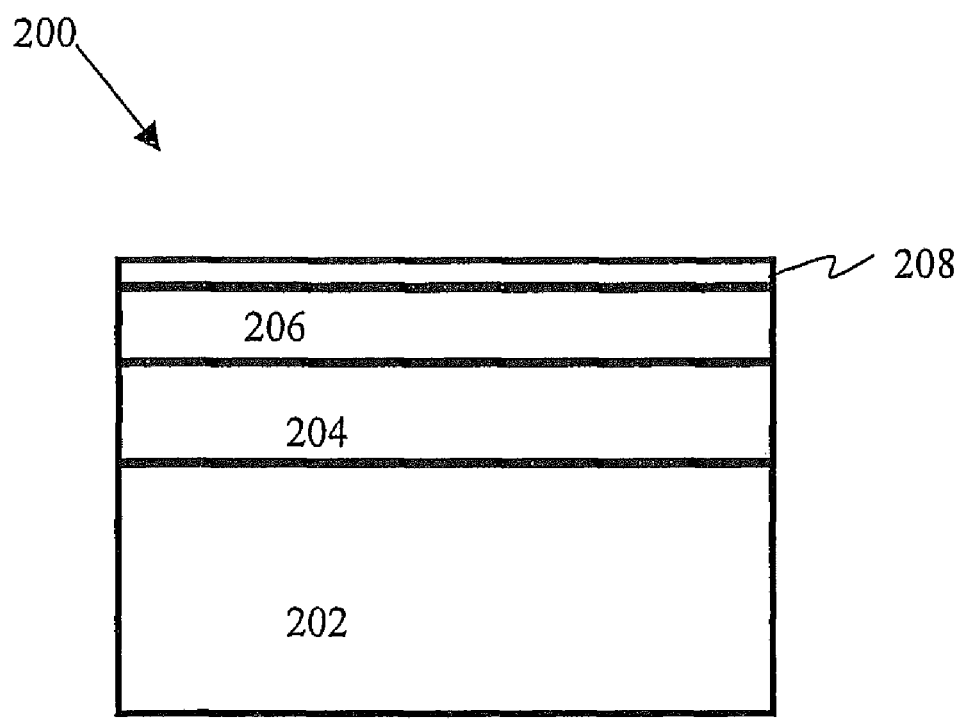
FIG. 2 shows a conventional prior art starting structure wafer 200 for forming one or more transistors.

Significant changes in Gm in the linear range is not desirable, because it leads to corresponding changes in the input capacitance, and hence the input impendence. These changes in input impendence, especially with frequency (because of capacitance change) are not desirable due to causes insertion loss input wave reflections in the GHz range of RF band. This causes signal loss and distortions. Thus, embodiments of the present invention may allow for better RF performance, lower insertion loss, and lower reflections FIG. 2 shows a conventional prior art starting structure wafer 200 for forming one or more transistors. The following discussion will detail the formation of a single transistor. Of course, the formation could be done in parallel to form several transistors simultaneously.

The structure 200 includes a bulk or base silicon layer 202, a buried oxide (BOX) layer 204 typically formed of SiO$_2$, a silicon-on-insulation (SOI) layer 206 and a silicon dioxide (oxide) layer 208. Of course, other wafer configurations could be utilized in accordance with the present invention.

Figure 3A:
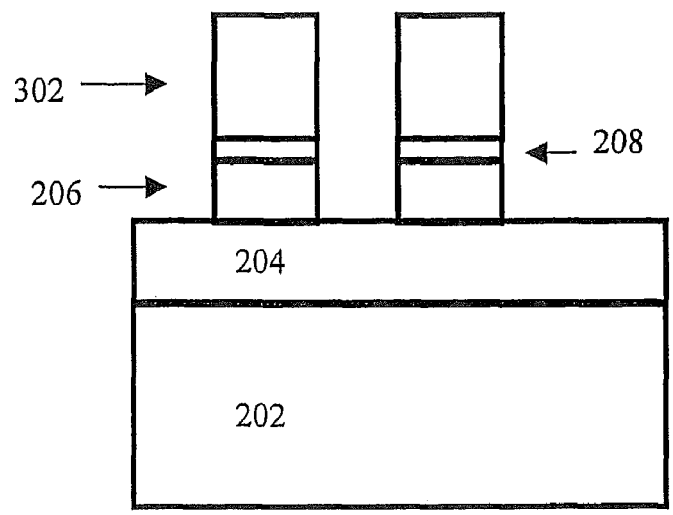
FIGS. 3a and 3b show an intermediate structure formed in the production of a FET in accordance with one embodiment of the present invention.
Figure 3B:
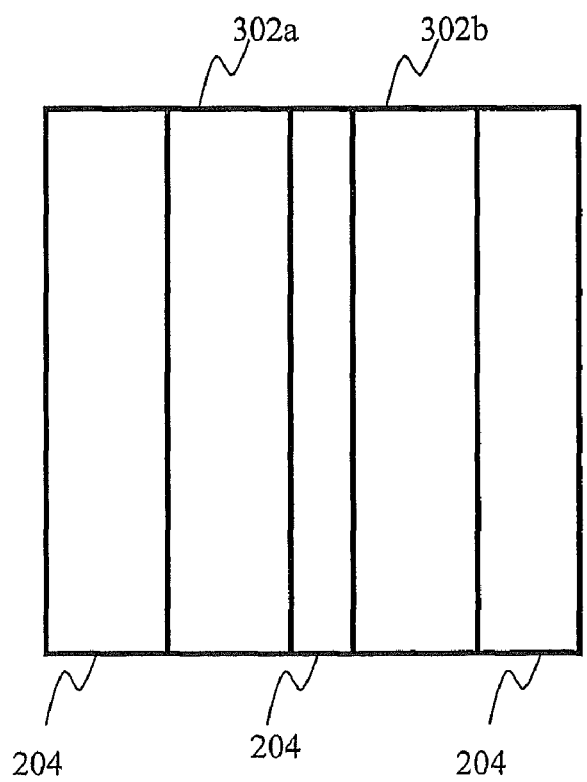

FIGS. 3a and 3b show an intermediate structure formed in the production of a FET in accordance with one embodiment of the present invention. FIG. 3a shows the result of placing a patterned photoresist layer 302 on top of the oxide layer 208. Utilizing standard techniques, portions of the oxide layer 208 and the SoI layer 206 not covered by the photoresist layer 302 are removed.

FIG. 3b shows a top plan view of the intermediate structure shown in FIG. 3a. In one embodiment, the photoresist is placed such that two parallel strips 302a and 302b exist. As will be shown below, such placement may help self-align the source and drain of the resulting FET according to one embodiment of the present invention. Of course, the strips 302a and 302b may have any width. In one embodiment, the width of the strips determines the depth of the body of the FET according to an embodiment of the present invention. In addition, the width of the air gap between the gate and the drain and the source is related to the spacing between the parallel strips 302a and 302b.

Figure 4A:
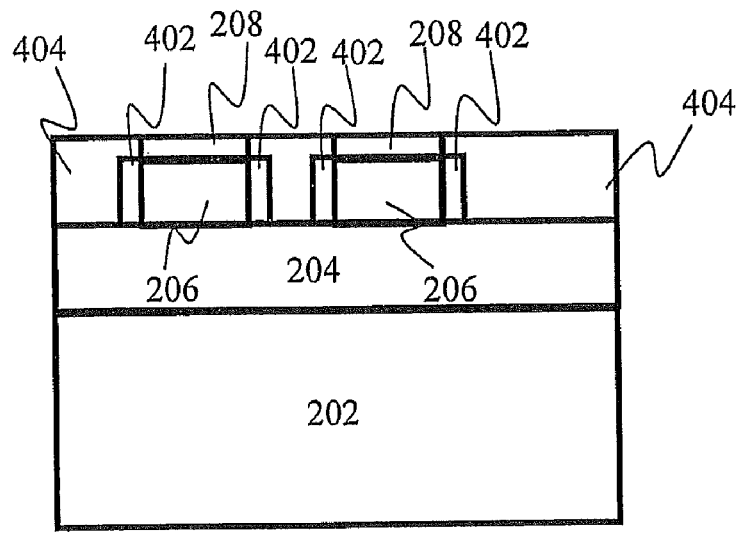
FIGS. 4a and 4b show another intermediate structure in the production of a FET according to an embodiment of the present invention.
Figure 4B:
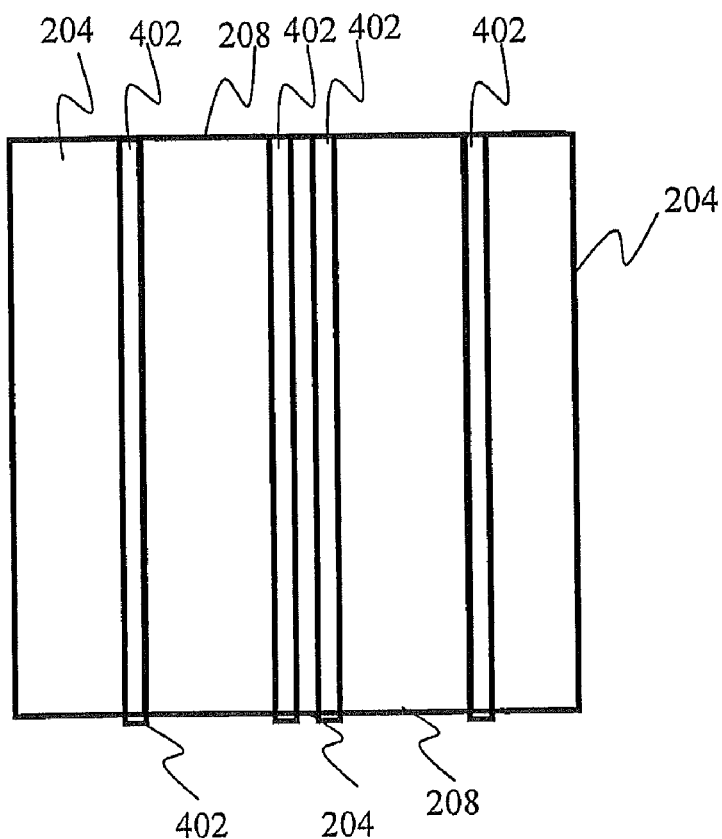

FIGS. 4a and 4b show another intermediate structure in the production of a FET according to an embodiment of the present invention. In FIG. 4a, the photoresist layer 302 shown in FIGS. 3a and 3b has been removed. After the photoresist layer has been removed, thermal oxide 402 is grown on the exposed sides of the remaining portions (strips 206a and 206b) of the SOI layer 206. In one embodiment, the thermal oxide 402 has a width between 120 and 150 angstroms. A second oxide layer 404 is deposited on top of the Box layer 204 such that it reaches or covers the top of the remaining portions of the oxide layer 208. In one embodiment, the second oxide layer 404 is deposited utilizing a chemical vapor deposition technique. A chemical mechanical planarization (CMP) may then be performed to level the top of the second oxide layer and expose the top of the remaining portions of the oxide layer 208.

FIG. 4b shows a top plan view of the intermediate structure shown in FIG. 4a. From this view, at this point in the production of the FET, the structure includes the strips 206a and 206b (not shown) which are covered by oxide 208 and which are surrounded by the thermal oxide 402. All of these portions are setting on top of the Box layer 204. For clarity, the second oxide layer 404 is not depicted in this top view as it would obscure a view of the thermal oxide 402.

Figure 5A:
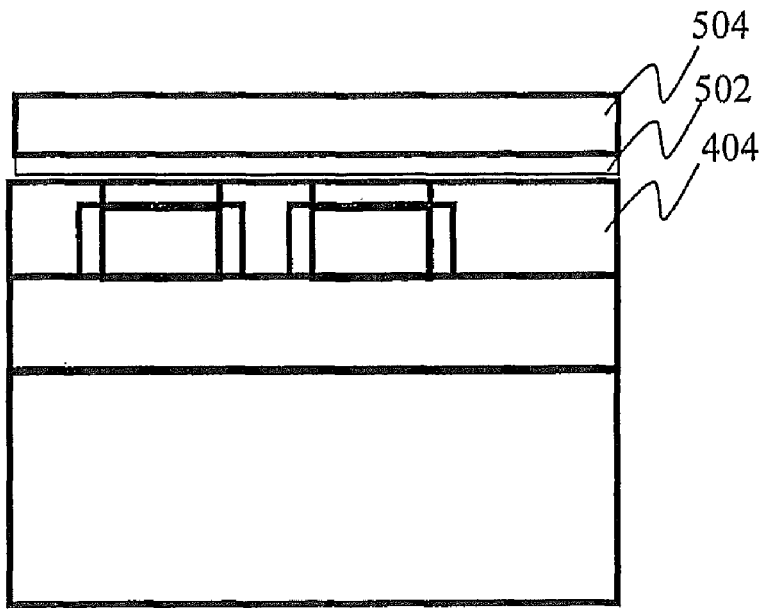
FIGS. 5a and 5b show another intermediate structure in the production of a FET according to an embodiment of the present invention.
Figure 5B:
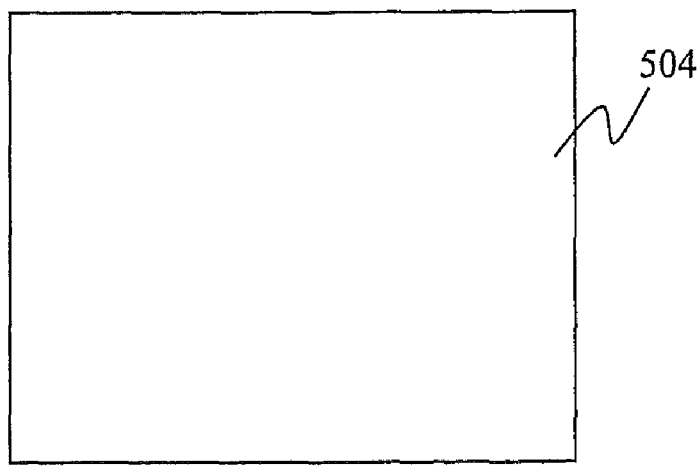

FIGS. 5a and 5b show another intermediate structure in the production of a FET according to an embodiment of the present invention. A nitride layer 502 is placed on top of the structure shown in FIG. 4a. On top of the nitride layer 502 a third oxide layer 504 may be placed. FIG. 5b shows a top plan view of the structure shown in FIG. 5a. At this time, the entire structure has been covered with the third oxide layer 504.

Figure 6A:
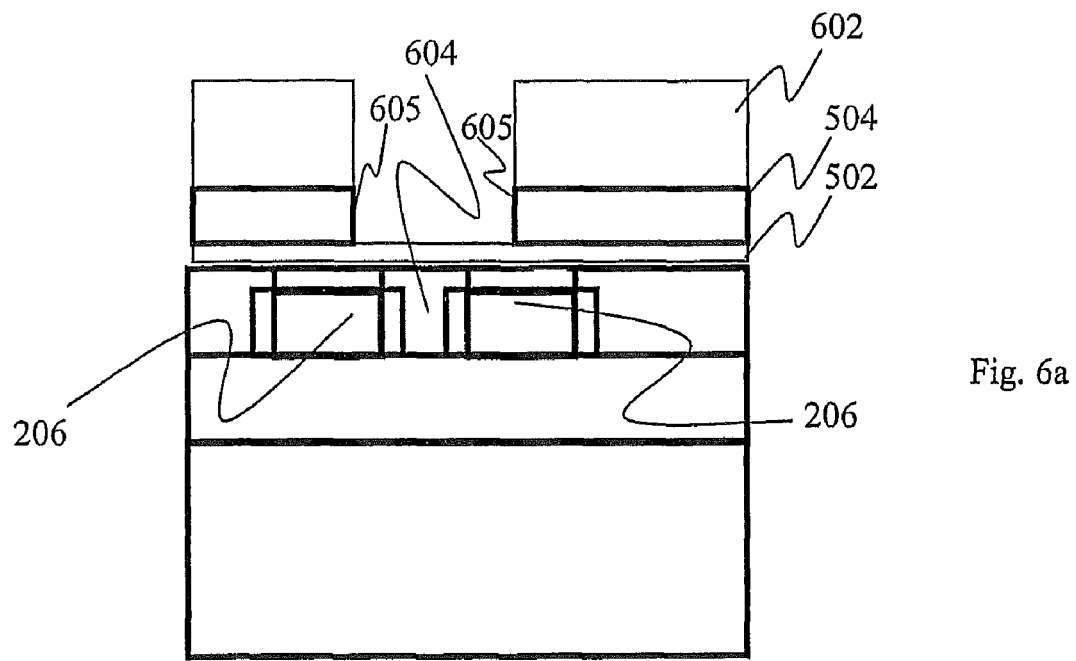
FIGS. 6a and 6b show another intermediate structure in the production of a FET according to an embodiment of the present invention.
Figure 6B:
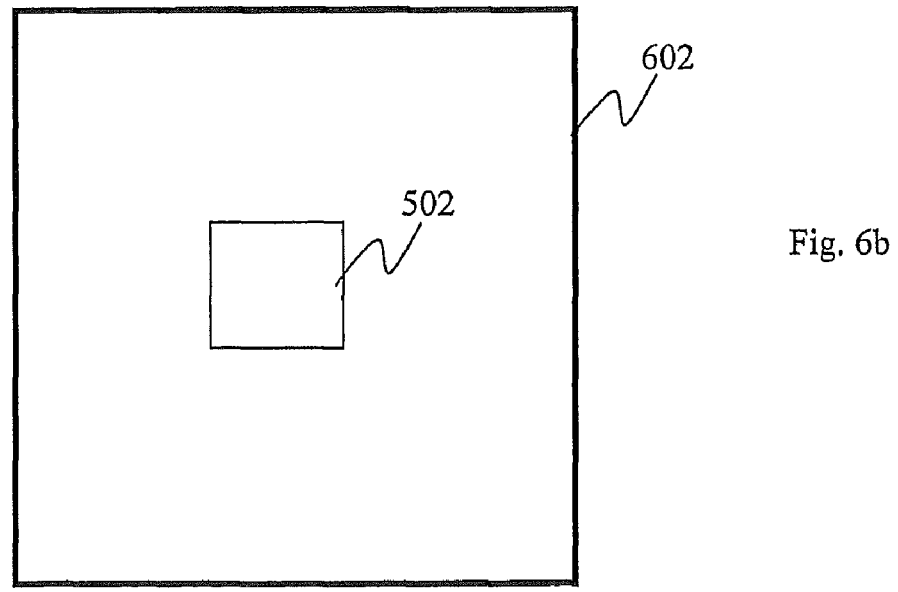

FIGS. 6a and 6b show another intermediate structure in the production of a FET according to an embodiment of the present invention. In particular, FIG. 6a shows the intermediate structure after a photoresist layer 602 has been formed on top of the third oxide layer 504, the photoresist layer 602 has patterned utilizing conventional techniques. The structure is then etched down to the nitride layer 502 utilizing conventional methods. In one embodiment, the photoresist layer 602 is patterned to create square or substantially square-like hole in the nitride layer 502. The edges 605 formed in the oxide layer 504 are preferably arranged (via the pattern on the photoresist layer 602) such that the region (denoted by reference numeral 604) of the second oxide layer 404 between the remaining portions 206 of the oxide layer is at least partially located between them when viewed from above. As discussed later, the region denoted 604 will eventually become the air gap according to one embodiment of the present invention.

FIG. 6*b* shows a top plan view of the intermediate structure shown in FIG. 6*a*. The photoresist 602 is the top layer and has a hole therein through which the nitride layer 502 may be viewed. As discussed above, in one embodiment, at least a portion of the region 604 (FIG. 6*a*) is located below the visible portion of the nitride layer 502.

Figure 7A:
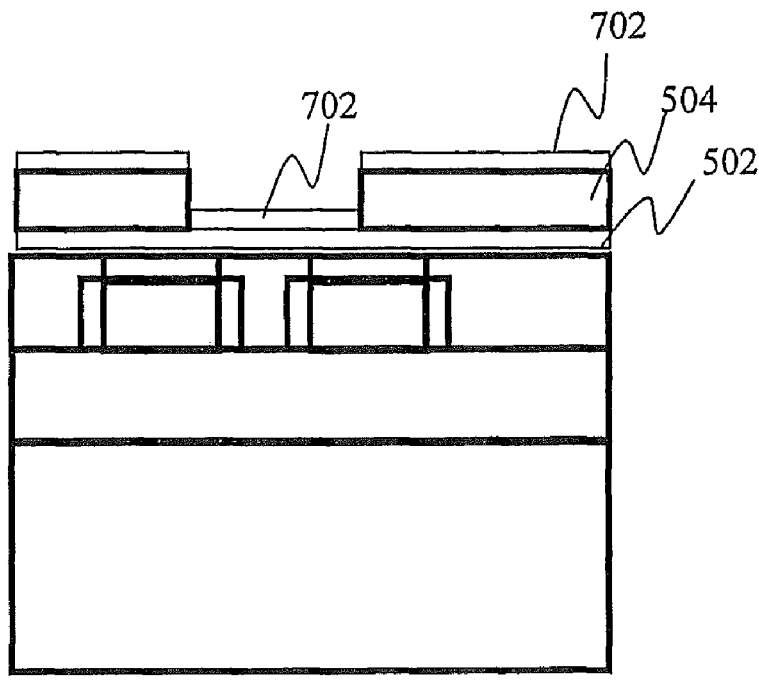
FIGS. 7a and 7b show another intermediate structure in the production of a FET according to an embodiment of the present invention.
Figure 7B:
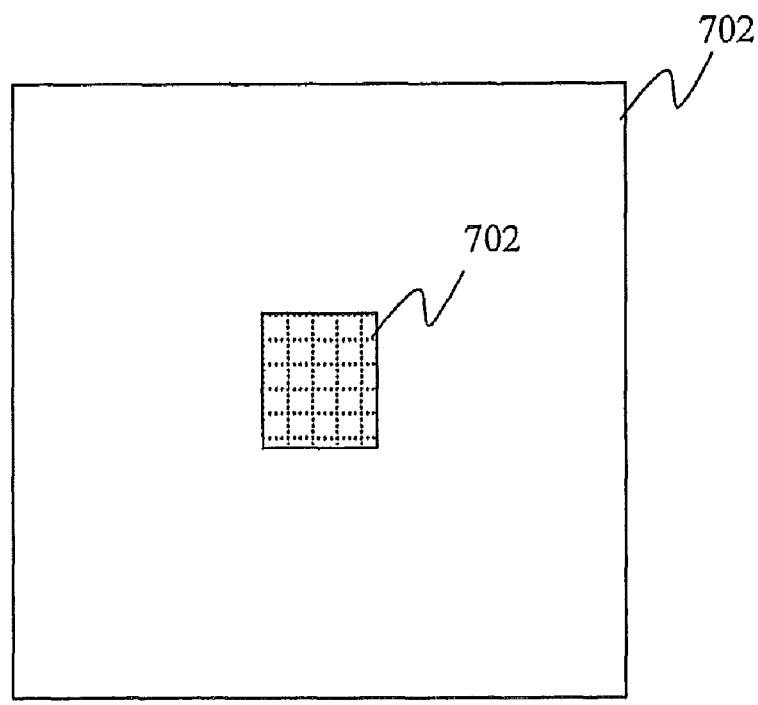

FIGS. 7*a* and 7*b* show another intermediate structure in the production of a FET according to an embodiment of the present invention. The intermediate structure shown in FIG. 6*a* has the photoresist layer 602 (FIG. 6*a*) removed and a layer of self aligned diblock copolymer 702 applied thereto. In one embodiment, the diblock copolymer layer 702 may be a spun on organic film. Such an organic film may include a chemical that is a mix of at least one hydrophobic compound and one hydrophilic compound. As is well known in the art, upon the application of heat, the two components in a diblock copolymer may self align to create a regular structure of two materials. One of the materials is chemically removed, resulting in only a single material in a porous film. For simplicity, only the portion of the diblock copolymer 702 within the square 704 (FIG. 7*b*) is shown as being in the porous state. Of course, the entire layer could be in such a state. In the porous state, the diblock copolymer 702 allows gasses and liquids to pass there through.

Figure 8:
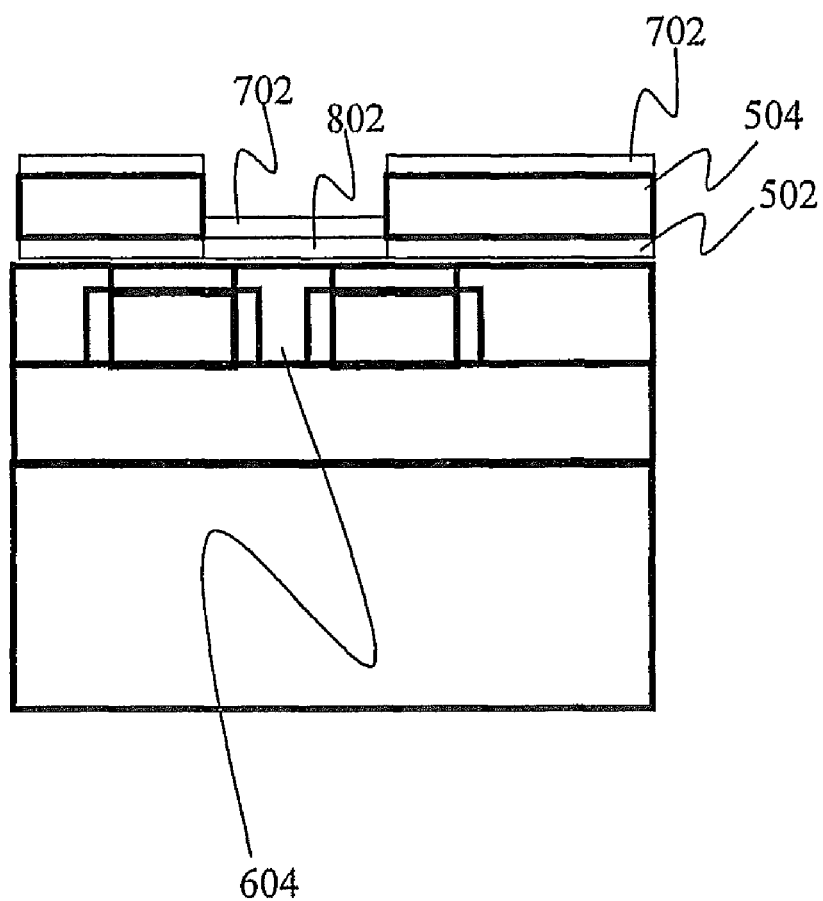
FIG. 8 shows the intermediate structure shown in FIG. 7a after an application of a nitride etching process has been performed thereon.

FIG. 8 shows the intermediate structure shown in FIG. 7*a* after an application of a nitride etching process has been performed thereon. Due to the porous nature of the dibock copolymer layer 702, the region 802 of the nitride layer 502 beneath the diblock copolymer 702 may be made porous by etching the region 802 of the nitride layer 502 through though the diblock copolymer layer 702. At this time, the region 604 may, through the holes in the region 802 of the nitride layer 502, be exposed to air.

Figure 9:
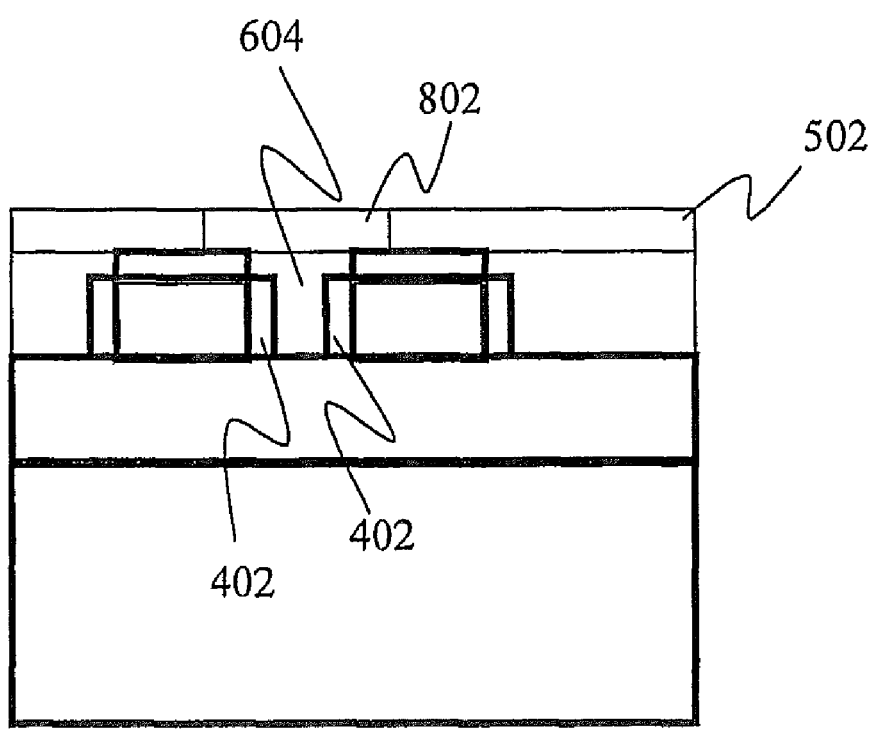
FIG. 9 shows the intermediate structure shown in FIG. 8 after any exposed oxide is stripped away.

As shown in FIG. 9, any exposed oxide is stripped away. This includes the oxide that was in region 604. Of course, due to the chemical properties thereof, the thermal oxide 402 is not removed as quickly and some of it preferably remains after all of the other oxide has been remove. The chemical used to remove the oxide, preferably hydrofluoric acid, also permeates the porous nitride, and removes any underlying oxide in region 604. At this time, the region 604 is a hollow region.

Figure 10:
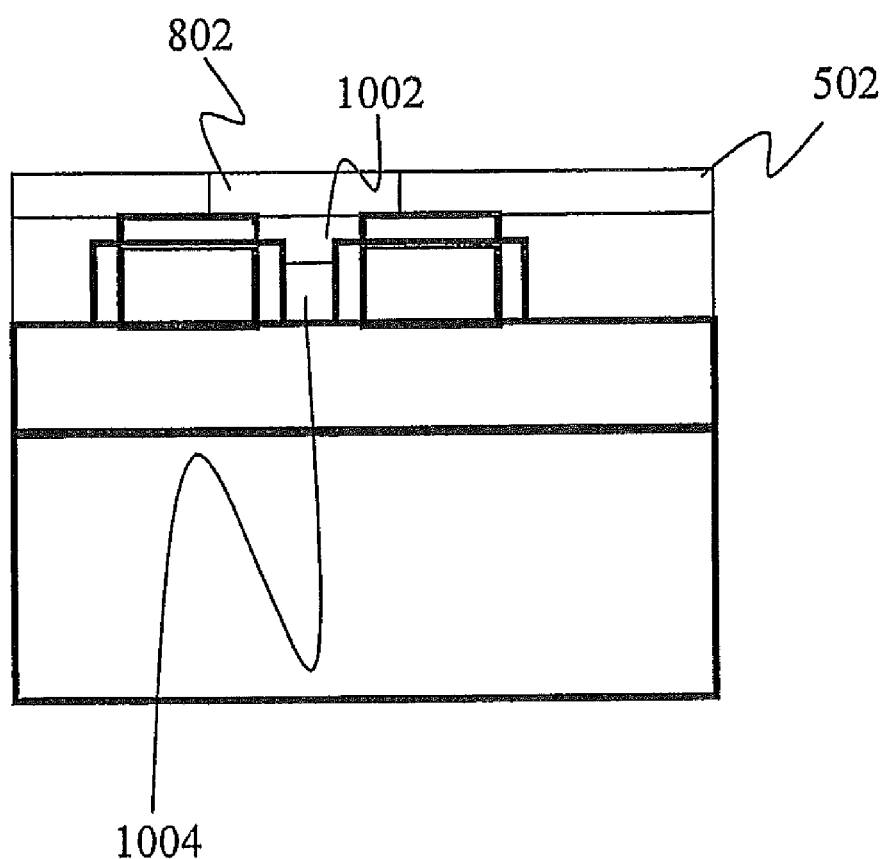
FIG. 10 shows another intermediate structure in the production of a FET according to an embodiment of the present invention.

FIG. 10 shows another intermediate structure in the production of a FET according to an embodiment of the present invention. As shown, the region 1004 (formerly 604) has now been sealed by blocker 1002. Blocker 1002 may, in one embodiment, be formed depositing an oxide utilizing chemical vapor deposition through the holes in the porous nitride region 802. Due to the conformal nature of the deposition, the tiny pores in the porous nitride region 802 may become constricted with the deposited material prior to completely filling region 1004. The region 1004 is the air gap according to the present invention.

Figure 11A:
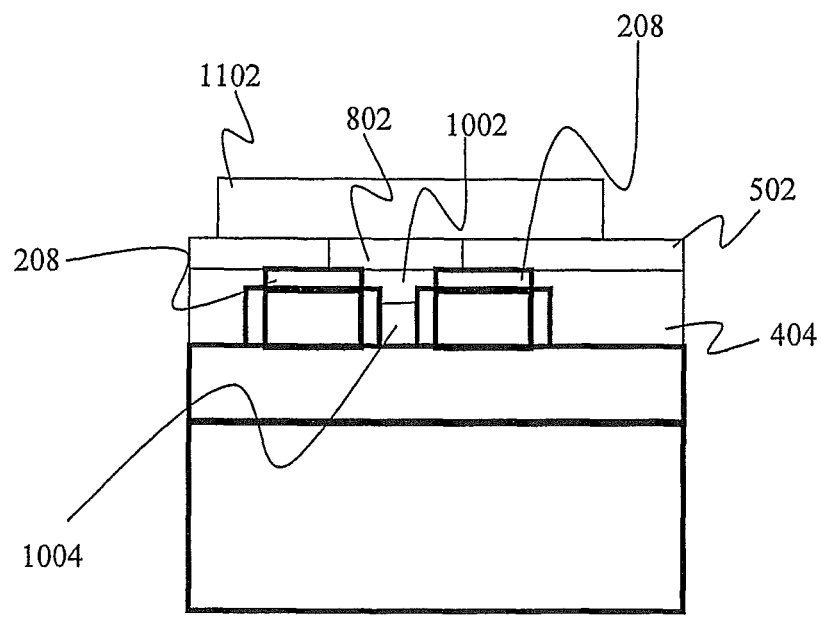
FIGS. 11a and 11b show another intermediate structure in the production of a FET according to an embodiment of the present invention.
Figure 11B:
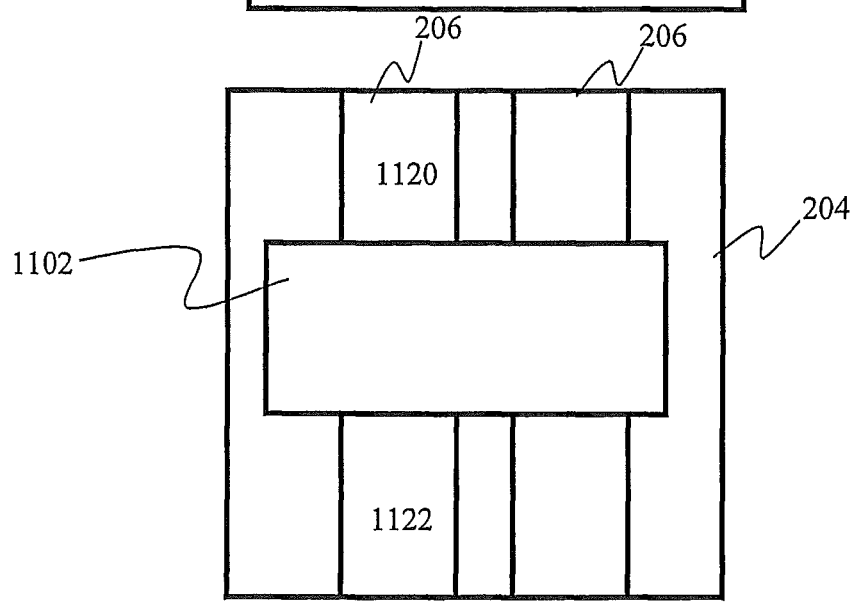

FIGS. 11*a* and 11*b* show another intermediate structure in the production of a FET according to an embodiment of the present invention. The nitride layer 502 is removed from the intermediate structure of FIG. 10. A strip of photoresist 1102 is then placed orthogonally to the silicon strips 206. The second oxide layer 404 may be removed from areas not covered by photoresist 1102 at this point. In addition, portions of the silicon layer 206 (FIG. 11*b*) may have doping ions implanted therein at this point to change the electrical characteristics of the silicon. For instance, the exposed regions 1120 and 1122 of one of the remaining strips of the silicon layer 206 may be doped to form the basis for the source and drain of a FET.

Figure 12:
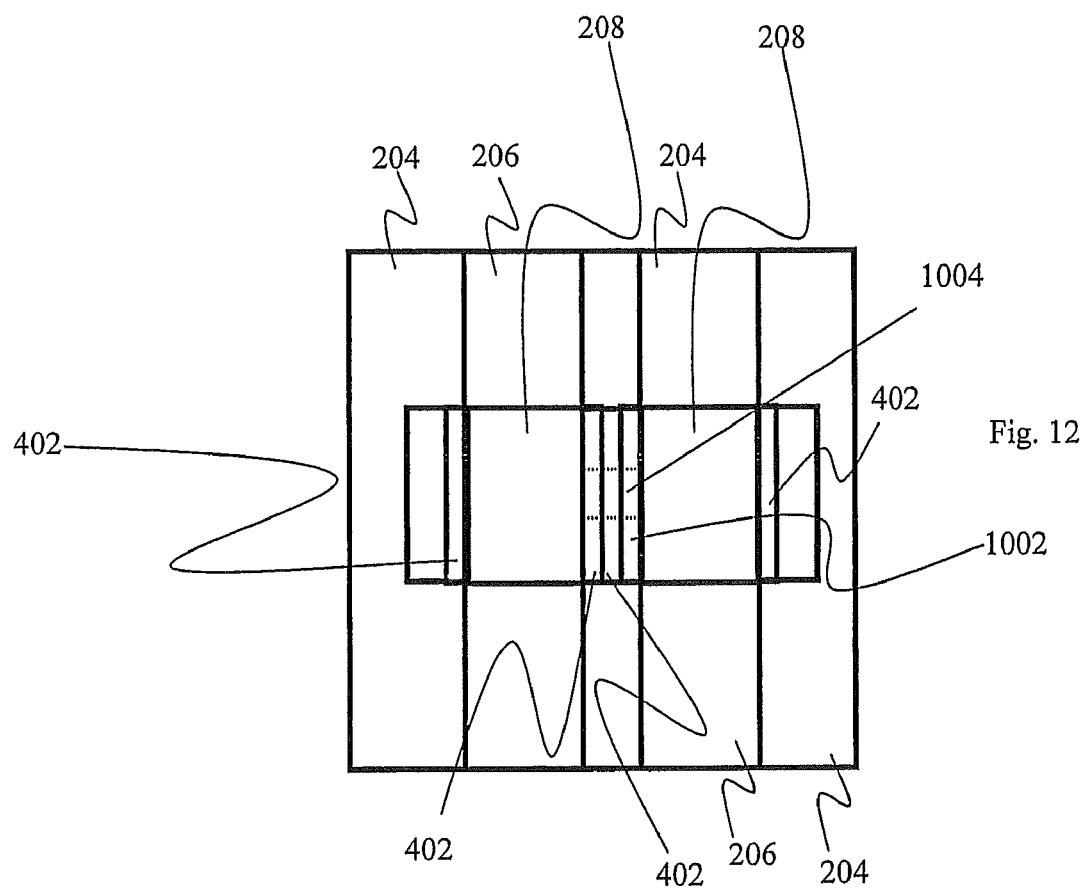
FIG. 12 shows another intermediate structure in the production of a FET according to an embodiment of the present invention after the photoresist of FIG. 11.

FIG. 12 shows another intermediate structure in the production of a FET according to an embodiment of the present invention after the photoreist 1102 of FIG. 11 has been removed. The removal of the photoresist reveals all of the strips silicon and other strips previously laid down. Further, and as shown in dashes and referred to by reference numeral 1004, an air gap exists between the silicon strips 206 at a level that is at or below the remaining portion 208 of the oxide layer. This air gap may also be referred to as a gate dielectric from time to time herein.

Figure 13A:
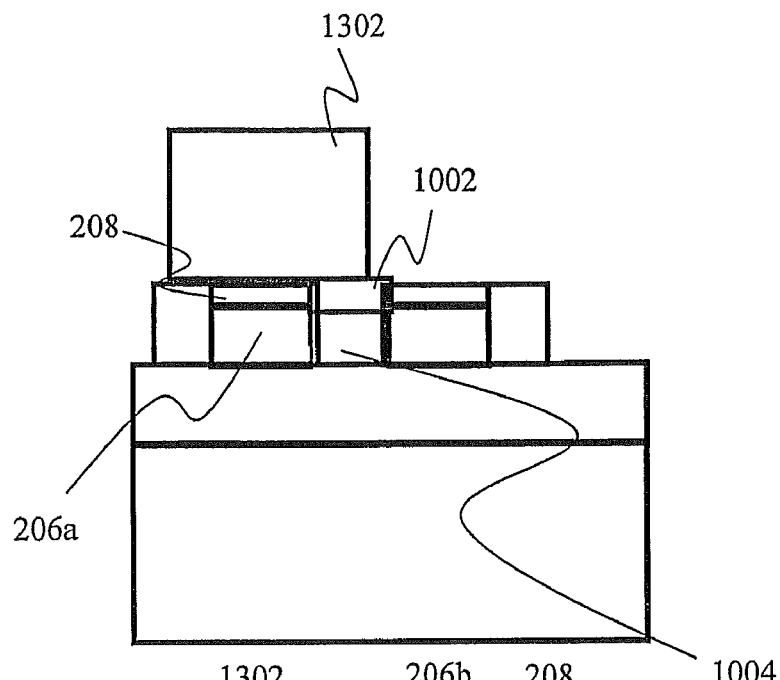
FIGS. 13a and 13b show another intermediate structure in the production of a FET according to an embodiment of the present invention.
Figure 13B:
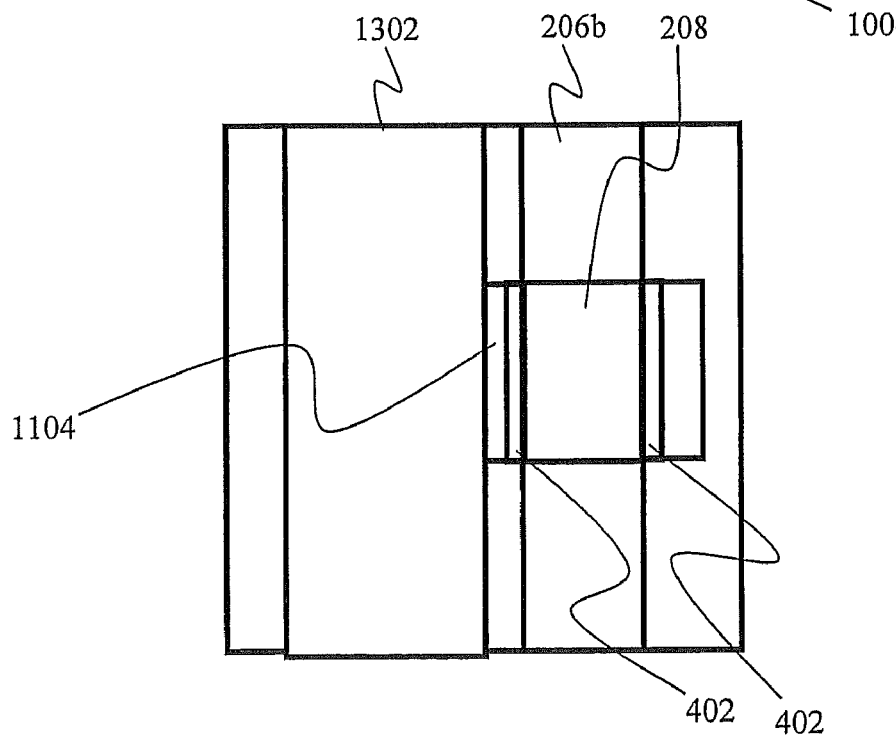

FIGS. 13*a* and 13*b* show another intermediate structure in the production of a FET according to an embodiment of the present invention. The structure in FIG. 13*a* is the same as the structure shown in FIG. 12 with a strip of photoresist 1302 arranged to cover the first silicon strip 206*a*. In addition, the photoresist 1302 may be arranged to cover at least a portion of the air gap 1004.

FIG. 13*b* shows a top plan view of the structure shown in FIG. 13*a*. In a preferred embodiment, the photoresist strip 1302 is created over the first silicon strip 206*a* such tha the first silicon strip 206*a* is completely covered. That is, the orientation of the photoresist strip 1302 is preferably oriented in the same direction as the first silicon strip. Or, in other words, the photoresist strip 1302 is arranged such that it is parallel with the second silicon strip 206*b* and does not cover the second silicon strip (206*b*).

Figure 14:
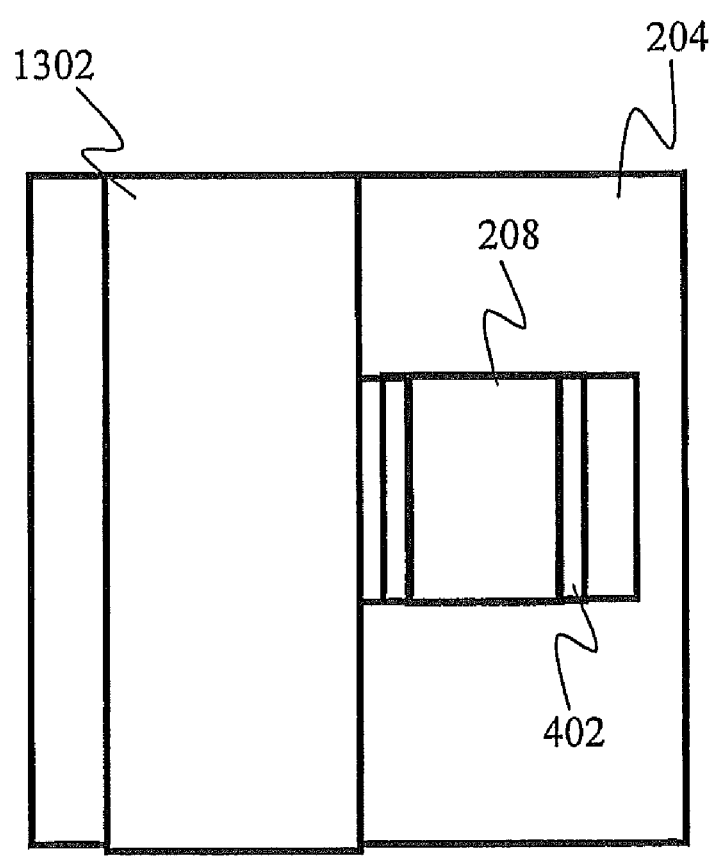
FIG. 14 shows a top plan view of intermediate structure shown in FIG. 13b after a silicon etching process has been performed.

FIG. 14 shows a top plan view of intermediate structure shown in FIG. 13*b* after a silicon etching process has been performed. The result is that on the portion of the intermediate structure not covered by the photoresist strip 1302 a "bump" having an oxide layer 208 on top of a silicon layer 206 (not shown). This "bump" is the gate of the FET. As shown in prior figures, the bump is separated from the portions under the photoresist strip 1302 by an air gap. The air gap serves to take the place of the gate dielectric layer typically used in prior art FET's.

Figure 15:
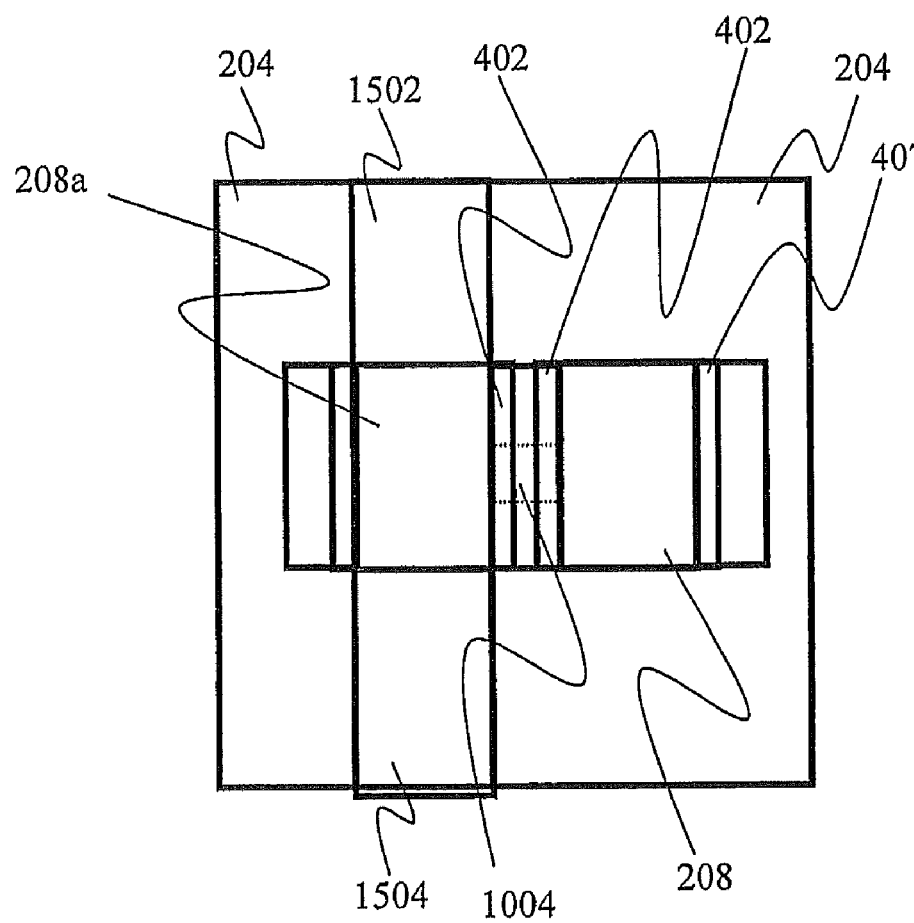
FIG. 15 shows the intermediate structure shown in FIG. 14 after the photo resist strip has been removed.

FIG. 15 shows shows the intermediate structure shown in FIG. 14 after the photoresist strip has been removed. The oxide layer 208*a* includes a silicon portion (not shown) below it that serves as a channel portion (forms the channel upon application of a voltage) of a FET. The portion 1502 (which was doped in a prior processing step) is the source and the portion 1504 (also doped in a prior step) is the drain (or vice versa). For clarity, the airgap 1004 is shown but in practice it would be obscured by other layers setting on top of it. One feature of the FET shown in FIG. 15 is that the gate, drain and source are all on the same level. That is, in opposition to the typical vertical orientation, where the gate sets above the drain and source, in the present invention, the gate may be coplanar with the drain and source. That is, an FET according to an embodiment of the present invention may be referred to as having a horizontal orientation because the gate, drain, source and body may all be in the same horizontal plane.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method of forming a field effect transistor (FET), the method comprising:
   forming first and second silicon strips, the first and second strips being substantially parallel to one another and separated from each other;
   filling a space between a portion of the first and second silicon strips with an oxide;
   covering the oxide with a nitride layer;
   forming a hole in the nitride layer;
   forming a porous pattern in the nitride layer, forming the pattern including placing a diblock copolymer on top of the nitride layer and, after the diblock copolymer has been self-aligned, etching the nitride through the diblock copolymer;
   etching the oxide through the nitride layer to form an airgap below the nitride layer; and
   sealing the air gap.

2. The method of claim 1, further comprising:
   forming a layer of thermal oxide on sides of the first and second strips.

3. The method of claim 2, wherein covering the oxide includes covering the thermal oxide.

4. The method of claim 1, further comprising:
   covering the first and second strips with an oxide layer.

5. The method of claim 1, wherein sealing includes:
   forming a sealing layer by chemically vapor depositing an oxide through the nitride layer.

* * * * *